(12) United States Patent
Sun et al.

(10) Patent No.: US 11,979,099 B2
(45) Date of Patent: May 7, 2024

(54) FLUID-INDUCED VIBRATION ENERGY HARVESTING APPARATUS WITH NON-ROTATING BLUFF BODY

(71) Applicant: JIANGSU UNIVERSITY, Zhenjiang (CN)

(72) Inventors: Wan Sun, Zhenjiang (CN); Yue Zhang, Zhenjiang (CN); Guanggui Cheng, Zhenjiang (CN); Jianning Ding, Zhenjiang (CN)

(73) Assignee: JIANGSU UNIVERSITY, Zhenjiang (CN)

( * ) Notice: Subject to any disclaimer, the term of this patent is extended or adjusted under 35 U.S.C. 154(b) by 0 days.

(21) Appl. No.: 18/021,809

(22) PCT Filed: Sep. 29, 2022

(86) PCT No.: PCT/CN2022/122526
§ 371 (c)(1),
(2) Date: Feb. 17, 2023

(87) PCT Pub. No.: WO2023/201991
PCT Pub. Date: Oct. 26, 2023

(65) Prior Publication Data
US 2023/0396191 A1 Dec. 7, 2023

(30) Foreign Application Priority Data
Apr. 22, 2022 (CN) .......................... 202210425925.5

(51) Int. Cl.
*H02N 2/18* (2006.01)

(52) U.S. Cl.
CPC .................................. *H02N 2/186* (2013.01)

(58) Field of Classification Search
CPC .............................. H02N 2/185; H02N 2/186
See application file for complete search history.

(56) References Cited

U.S. PATENT DOCUMENTS

2021/0336561 A1   10/2021   Song et al.

FOREIGN PATENT DOCUMENTS

| CN | 104113232 A |   | 10/2014 |   |   |
|----|-------------|---|---------|---|---|
| CN | 109889094 A |   | 6/2019  |   |   |
| CN | 112910312 A | * | 6/2021  | ............ | H02N 2/185 |
| CN | 114844392 A |   | 8/2022  |   |   |
| CN | 115076027 A | * | 9/2022  | ............ | H02N 2/186 |
| KR | 20200110486 A | * | 9/2020 | ............ | H02N 2/185 |
| KR | 20200110487 A | * | 9/2020 | ............ | H02N 2/185 |

* cited by examiner

*Primary Examiner* — J. San Martin
(74) *Attorney, Agent, or Firm* — Bayramoglu Law Offices LLC

(57) ABSTRACT

A fluid-induced vibration energy harvesting apparatus with a non-rotating bluff body is provided. The apparatus does not use a common design method of rigidly securing a bluff body to an elastic beam in a design of the bluff body, but adopts a manner of connecting the bluff body and the elastic beam through a rotating shaft and a connecting shaft. Because a kinematic pair at a connection position is a rotating pair, the bluff body will only vibrate transversely and will not rotate, thereby achieving an effect of increasing an amplitude at the same frequency, and finally realizing an increase of converted electric energy and improving the conversion efficiency.

6 Claims, 5 Drawing Sheets

FLUID-INDUCED VIBRATION ENERGY HARVESTING APPARATUS WITH NON-ROTATING BLUFF BODY

CROSS REFERENCE TO THE RELATED APPLICATIONS

This application is the national phase entry of International Application No. PCT/CN2022/122526, filed on Sep. 29, 2022, which is based upon and claims priority to Chinese Patent Application No. 202210425925.5, filed on Apr. 22, 2022, the entire contents of which are incorporated herein by reference.

TECHNICAL FIELD

The present disclosure relates to a fluid-induced vibration energy collecting apparatus, and in particular, to a fluid-induced vibration energy harvesting apparatus with a non-rotating bluff body, which is mainly used for maximizing conversion of vibration energy into electric energy and collecting the electric energy.

BACKGROUND

In recent years, due to environmental problems and non-renewable use of fossil energy, renewable energy collection technologies have received widespread attention. In the past two decades, wireless sensor networks have been widely applied in various fields, and a self-powered wireless sensor network technology has been developed. Cyclic utilization of energy has become a scientific problem of great significance worldwide. At the same time, energy collection has become an emerging technology that can convert waste energy in an environment into electric energy, and has an unlimited application prospect in the field of self-energy design of microelectronic devices, and has been widely concerned by researchers at home and abroad.

Wind energy is a common energy source, and a wind driven generator is a typical energy conversion apparatus, which may be used for realizing conversion from wind energy to electric energy. At present, after wind energy is converted into a vibration energy source through a wind-induced effect, because of advantages of a piezoelectric effect, such as a simple structure, a high output voltage, and a high power density, most of the wind energy is converted into electric energy in a manner of the piezoelectric effect, which has become a main choice of vibration energy collection. However, the wind driven generator may produce strong noise during operation, and it is highly dependent on strong wind. The above shortcomings limit its operation in regions with high population density. Therefore, in an urban environment, a small but independent power source is essential. Therefore, an appropriate and realizable solution is needed to apply to a self-powered sensor node and a monitoring device.

In order to reduce the dependence of a wireless sensor on a traditional battery power source, energy collecting apparatuses based on piezoelectric, electromagnetic, electrostatic, triboelectric, and dielectric elastomers have developed rapidly. As a substitute for a traditional turbine, a fluid-induced vibration energy collecting apparatus may also convert low-speed wind energy in the environment into electric energy, and may be classified, according to a mechanism of action of fluid-solid interaction, into buffeting, vortex-induced vibration, galloping, and wake galloping. Due to the convenience of the implementation solution, energy collecting apparatuses based on vortex-induced vibration and galloping have been widely studied, and their structural design takes advantage of unstable fluid-solid coupling between a flow field and a bluff body. However, the energy efficiency of the existing energy collecting apparatus with the same bluff body is not high.

SUMMARY

In view of the shortcomings of the prior art, the present disclosure provides a fluid-induced vibration energy harvesting apparatus with a non-rotating bluff body, which can absorb wind-induced vibration energy in an external environment and convert it into electric energy. With the continuous improvement of production technologies, power of small electronic components continuously declines. The apparatus of the present disclosure can supply power for a low-energy consumption device such as a wireless sensor node and a detection device, thereby avoiding disadvantages of the traditional battery power supply.

In order to achieve the above objectives, the present disclosure does not use a common design method of rigidly securing a bluff body to an elastic beam in a design of the bluff body, but adopts a manner of connecting the bluff body and the elastic beam through a rotating shaft and a connecting shaft. Because a kinematic pair at a connection position is a rotating pair, the bluff body will only vibrate transversely and will not rotate, thereby achieving an effect of increasing an amplitude at the same frequency, and finally realizing an increase of converted electric energy and improving conversion efficiency.

A fluid-induced vibration energy harvesting apparatus with a non-rotating bluff body is provided, including a bluff body, a rotating shaft, a connecting shaft, elastic beams, a piezoelectric film, mounting blocks, fixing frames, a sliding rail, sliding blocks, and a fastening device.

The bluff body as a whole is in a shape of a thin-walled cuboid with non-closed upper and lower ends. A rectangular groove is reserved on each of two edges connected to each of the elastic beams respectively. An upper end face of the rectangular groove is provided with an upper square entity, and a lower end face of the rectangular groove is provided with a lower square entity. The upper square entity and the lower square entity are provided with a through hole and a blind hole respectively, for placing the rotating shaft. The through hole and the blind hole are in clearance fit with the rotating shaft to avoid a shaking phenomenon.

The rotating shaft is slender cylinder shaped, and the rotating shaft is also in clearance fit with a central hole of the connecting shaft.

The connecting shaft has one side provided with the central hole protruded for connecting to the rotating shaft and an other side being a rectangular sheet connected to each of the elastic beams through an adhesive.

There are two elastic beams, which are made of a titanium alloy material to ensure a large elastic force and restoring force, and are in a type of cantilever beams. Each of the elastic beams is placed between two mounting holes of each of the mounting blocks and between the fixing frames and the mounting blocks, and is fastened by bolts.

The piezoelectric film is made of epoxy resin. The piezoelectric film is attached to a root of each of the elastic beams to achieve high efficiency of energy conversion, as a fixed end of each of the elastic beams has a maximum stress and maximum deformation.

The mounting blocks are generally rectangular, and there are two mounting blocks. Each of the mounting blocks includes the two mounting holes, and the two mounting holes are consistent with two mounting holes on an upper end of each of the fixing frames in shape and size.

The fixing frames are L-shaped as a whole, and there are two fixing frames. A lower end of each of the fixing frames has four positioning holes. The positioning holes are consistent with positioning holes on upper surfaces of the sliding blocks in shape and size, and are configured for connecting to the sliding blocks. The upper end of each of the fixing frames is provided with the two mounting holes configured for connecting to the mounting blocks.

The sliding rail is in a shape of a cuboid block as a whole, with two rotatable slender shafts on two internal sides and two countersunk holes at a bottom for connecting to a bottom of a wind tunnel.

The sliding blocks are T-shaped as a whole, and there are two sliding blocks. An upper surface of each of the sliding blocks is provided with four positioning holes for connecting to each of the L-shaped fixing frames. A symmetrical center of a lower end of each of the sliding blocks is provided with three rotating bearings arranged at equal intervals for cooperating with the slender shafts of the sliding rail, to achieve smooth movement of the sliding blocks on the sliding rail.

The fastening device includes an external handle, a spring, and a stopper. One end of the external handle is connected to the spring, and one end of the spring is connected to the stopper. The spring and the stopper of the fastening device are placed as a whole in a groove at the lower end of each of the sliding blocks. When a distance between the two sliding blocks is adjusted to be appropriate, the external handle is rotated clockwise to squeeze the spring to drive the stopper to move axially towards an inner sidewall of the sliding rail, until the inner sidewall is touched indicating that tightening is complete and positions of the sliding blocks are fixed.

Advantages of the Present Disclosure

The present disclosure provides a fluid-induced vibration energy harvesting apparatus with a non-rotating bluff body, which has the following advantages:

The fluid-induced vibration energy harvesting apparatus with a non-rotating bluff body has a simple structure. Main parts, such as the bluff body and the connecting shaft, are manufactured by a 3D printing technology, and thus are light in weight and can avoid unnecessary energy loss in the wind tunnel. In a previous common design, the bluff body may form an included angle with respect to an axis as it swings left and right along with the elastic beams. Pressures caused by different angles on both sides will be different, and the bluff body may swing continuously until the pressures on both sides of the bluff body are balanced. Then the bluff body swings in a reverse direction, and the process cycles repeatedly. The bluff body design of this apparatus is different in that there are two elastic beams and the bluff body and the elastic beams are rotatable relatively. Therefore, when the elastic beams swing, a motion structure between the bluff body and the elastic beams may be simplified to a parallelogram. The bluff body will only vibrate laterally relatively, and there will be no included angle with respect to the axis. A wind force will act more effectively on a front end face of the bluff body, which is equivalent to increasing an amplitude at the same frequency, thereby improving the collected energy and increasing the power density. In this regard, it has been verified in an experiment, and this conclusion may also be reached by comparing amplitude changes of a conventional energy collecting apparatus with a rotating translation-coupled bluff body and the fluid-induced vibration energy harvesting apparatus with the non-rotating bluff body of the present disclosure under different wind speeds. Comparison of experimental data is given in FIG. 5.

This apparatus can make up for defects of the existing vibration energy collection technology, for example, the energy collecting apparatus can only vibrate along the same track as a securing member, a vibration amplitude that can be collected is low, and the energy collection efficiency is low. The present disclosure may be applied in a wide range of scenarios, and can effectively collect vibration energy in a working environment even if there are multi-directional and multi-frequency vibrations in the working environment.

Figure 1A:
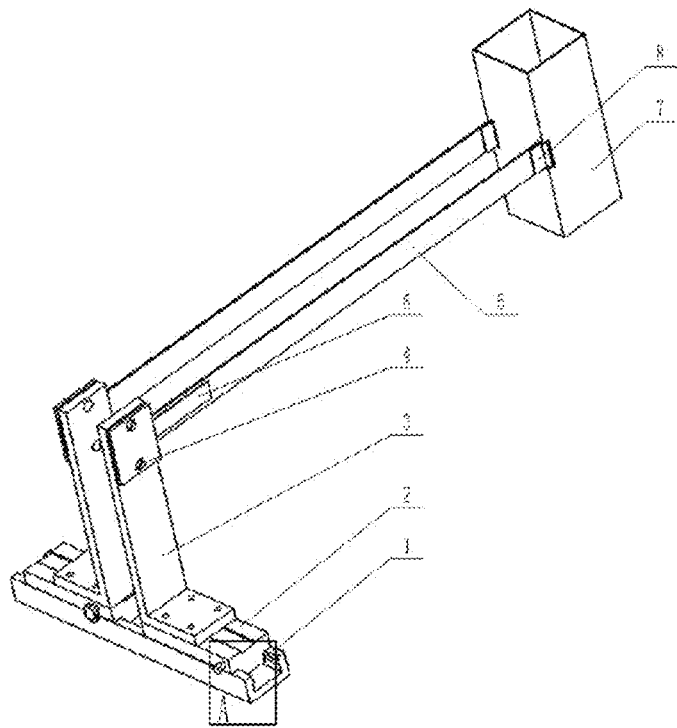
FIGS. 1A and 1B show a schematic three-dimensional structural diagram of a fluid-induced vibration energy harvesting apparatus with a non-rotating bluff body according to the present disclosure, and reference numerals of corresponding compositions and structures have been marked.
Figure 1B:
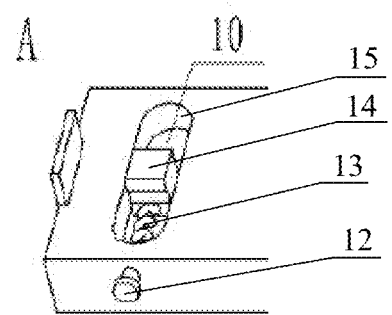

In the figures: 1-Sliding rail; 2-Sliding block; 3-Fixing frame; 4-Mounting block; 5-Elastic beam; 6-Piezoelectric film; 7-Bluff body; 8-Connecting shaft; 9-Rotating shaft; 10-Fastening device; 11-rectangular groove; 12-external handle; 13-spring; 14-stopper; 15-inner sidewall.

DETAILED DESCRIPTION OF THE EMBODIMENTS

In order to fully understand purpose, features, and efficacies of the present disclosure, the present disclosure is described in detail by the following specific implementations.

As shown in FIGS. 1A and 1B, FIG. 2, FIGS. 3A and 3B, and FIG. 4, a fluid-induced vibration energy harvesting apparatus with a non-rotating bluff body of the present disclosure includes a sliding rail 1, a sliding block 2, a fixing frame 3, a mounting block 4, an elastic beam 5, a piezoelectric film 6, a bluff body 7, a connecting shaft 8, rotating shaft 9, and a fastening device 10. The sliding rail 1 is a bottommost part of the energy harvesting apparatus of the present disclosure. A lower end of the sliding rail 1 is fixedly fitted to a wind tunnel box. The sliding block 2 on the sliding rail 1 is connected to the fixing frame 3, for adjusting a spacing. By adjusting relative positions of the fixing frame 3 and the sliding rail 1, a spatial position of the bluff body 7 in the wind tunnel box may be changed, so as to keep the bluff body 7 in a central position of a wind tunnel section and reduce an adverse effect of turbulence on an experiment. The elastic beam 5 is located between two holes of the mounting block 4 and is fixed between the fixing frame 3 and the mounting block 4. The piezoelectric film 6 is adhered at a root of an exposed fixed end of the elastic beam 5. Because the root has the largest deformation, a highest energy conversion efficiency may be obtained. In addition, a free end of the elastic beam 5 is bonded to the connecting shaft 8.

Figure 2:
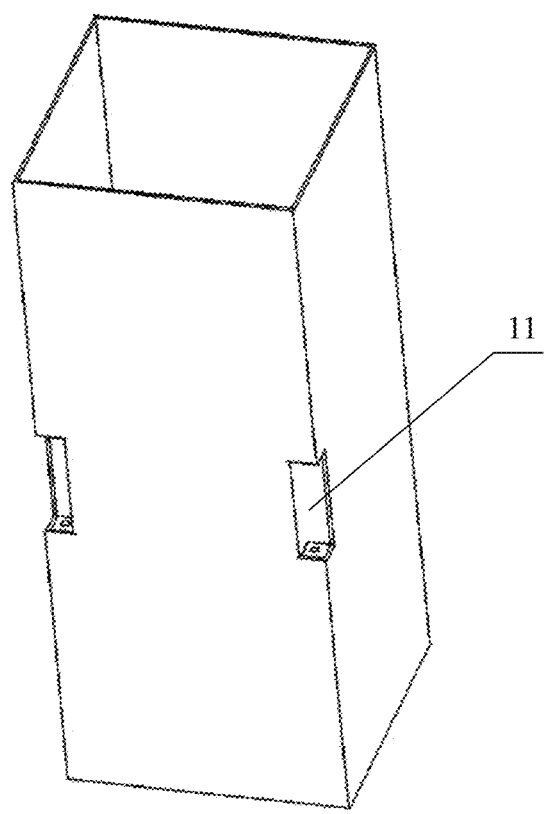
FIG. 2 is a schematic diagram of an internal structure of a bluff body according to the present disclosure, and reference numerals of corresponding compositions and structures have been marked.
Figure 3A:
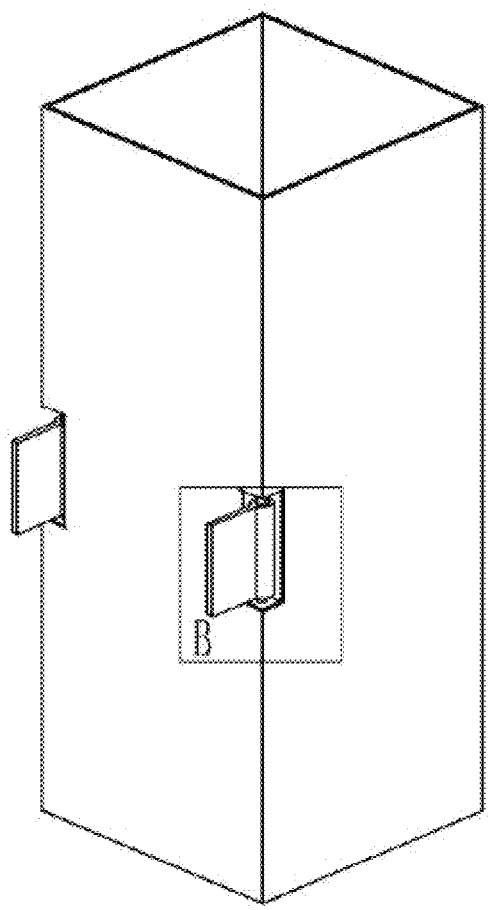
FIGS. 3A and 3B show a schematic structural diagram of cooperation of a connecting shaft and a rotating shaft according to the present disclosure, and reference numerals of corresponding compositions and structures have been marked.
Figure 3B:
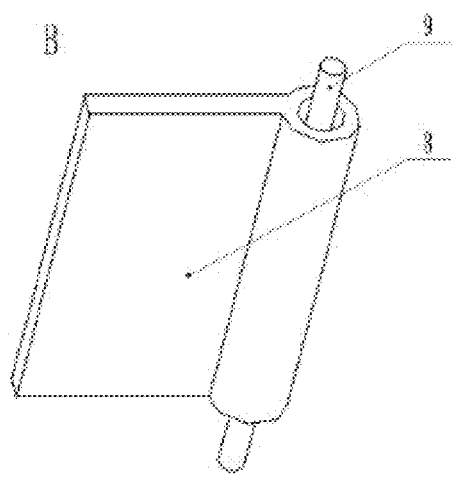

As shown in FIG. 2 and FIGS. 3A and 3B, the bluff body 7 is a rightmost part of the energy harvesting apparatus of the present disclosure. A wind force acts directly on an end face of the bluff body 7. In addition, the rotating shaft 9 passes through the connecting shaft 8 and is placed in a rectangular groove 11 of the bluff body 7, and is rotatable freely.

Figure 4:
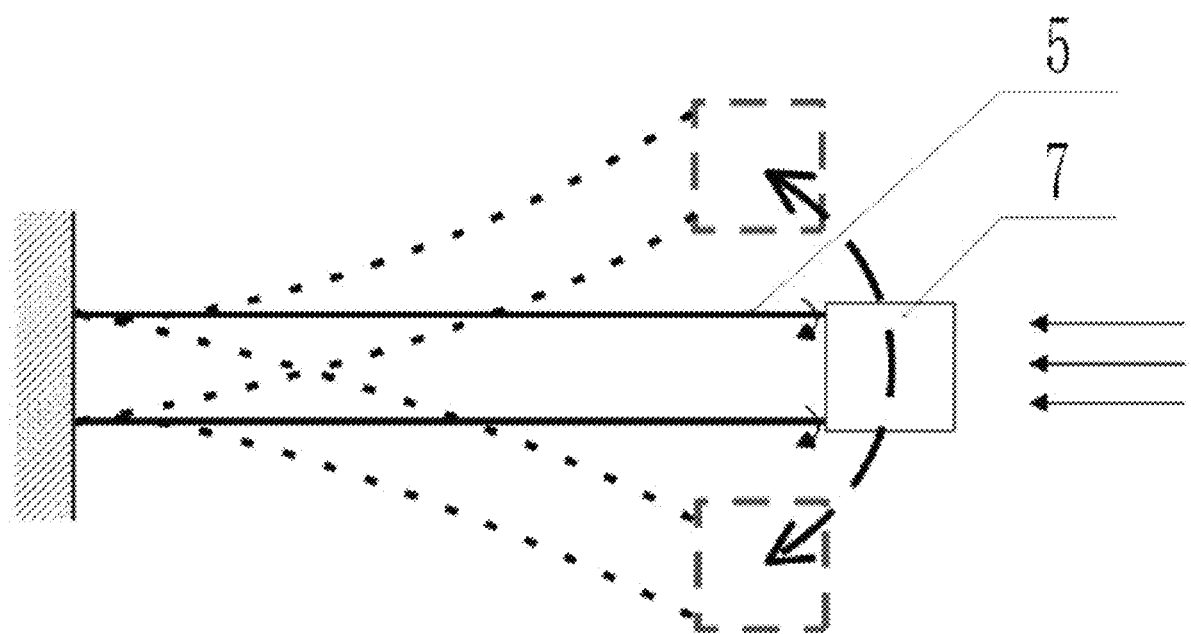
FIG. 4 is a schematic diagram of a working principle of a fluid-induced vibration energy harvesting apparatus with a non-rotating bluff body according to the present disclosure, and reference numerals of corresponding compositions and structures have been marked.
Figure 5:
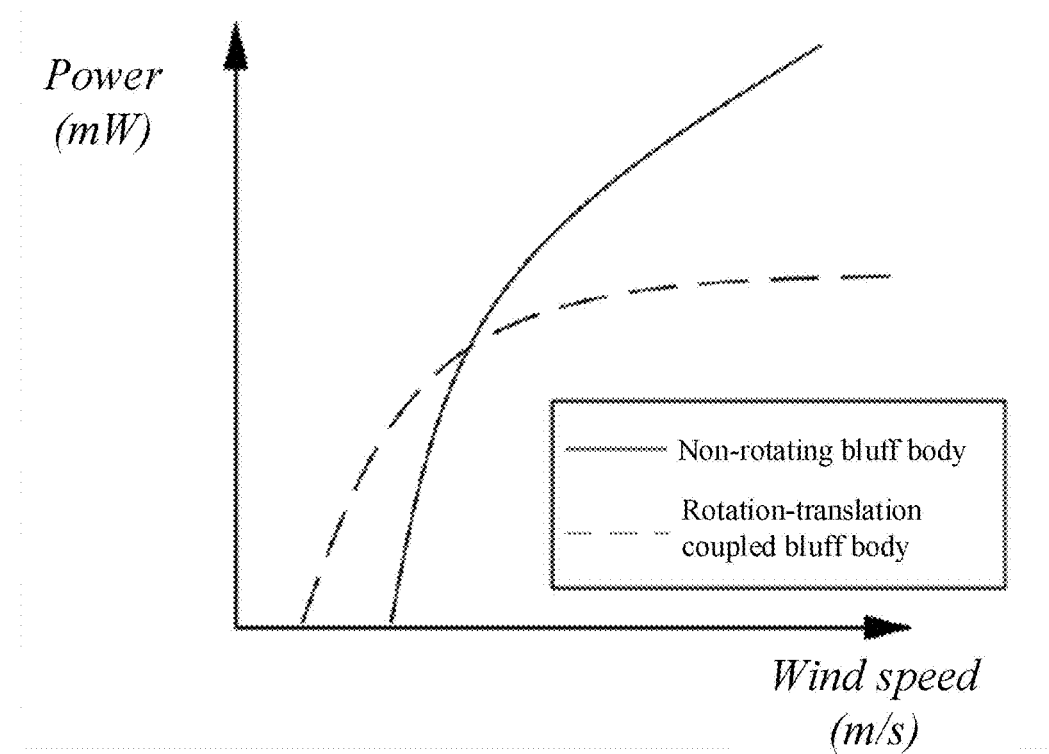
FIG. 5 is a comparison diagram of experimental data, and a corresponding model of curves has been marked.

As shown in FIG. 4, a working principle of the energy harvesting apparatus is that the bluff body 7 and the elastic beam 5 are rotatable with respect to each other, and therefore when the wind force acts on the bluff body, the bluff body will only vibrate laterally, thereby achieving an experimental purpose.

Working Process

Figure 6:
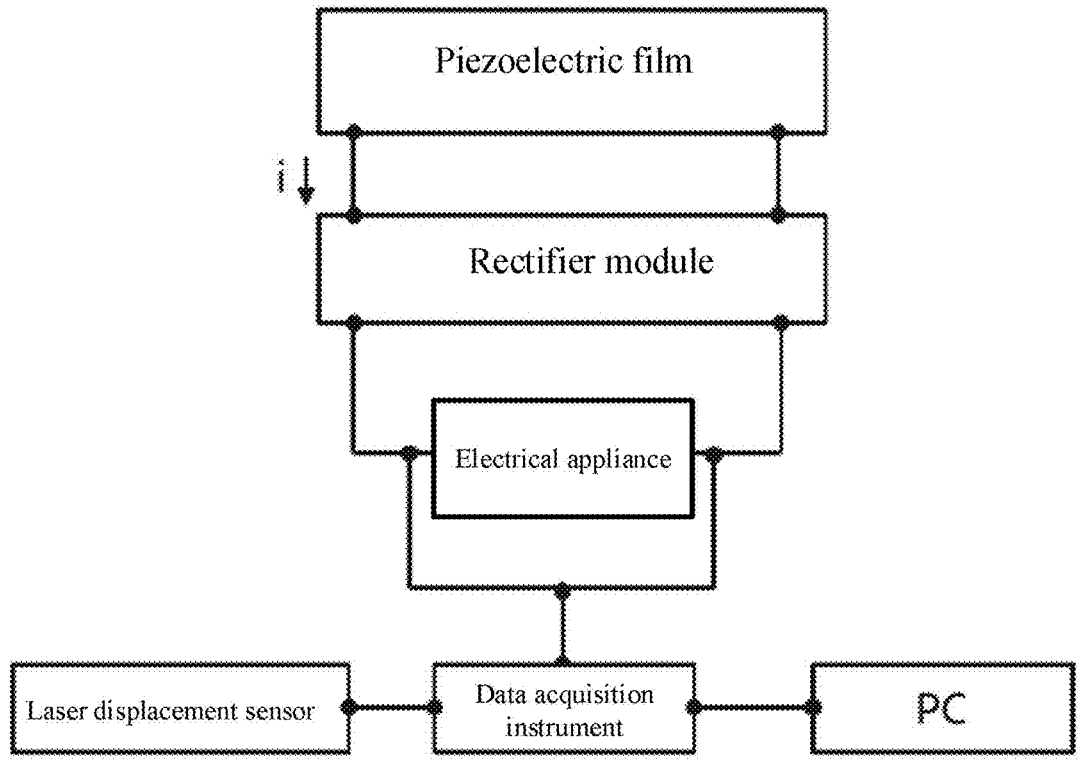
FIG. 6 is an output circuit diagram of a fluid-induced vibration energy harvesting apparatus with a non-rotating bluff body according to the present disclosure.

After the wind tunnel is powered on, it starts to work. An air flow is sucked in from a wind tunnel inlet and acts on the front end face of the bluff body 7. The bluff body 7 is forced to drive the elastic beam 5 to bend. A wind-induced effect converts wind energy into vibration energy. The bluff body 7 and the elastic beam 5 are rotatable with respect to each other, so that the bluff body 7 vibrates laterally and the elastic beam swings left and right in an equal amplitude. The piezoelectric film 6 at the root of the elastic beam 5 is subjected to a pressure and converts the pressure into electric energy in the form of a piezoelectric effect. The piezoelectric film 6 is connected to an external circuit, outputs a voltage signal to be measured and processed by a data acquisition instrument, and is connected to a PC for data monitoring and processing. A low-power consumption appliance may be connected to the external circuit to make full use of the converted electric energy. In addition, the wind tunnel box is made of a transparent acrylic plate, a laser displacement sensor is mounted on a side thereof, and an anemometer is mounted above the wind tunnel box to measure an instantaneous upstream wind speed, so as to adjust different variable values required by the experiment in real time through mutual cooperation. An overall circuit diagram is shown in FIG. 6.

The above specific implementation has described the technical solution and advantages of the present disclosure in detail. It should be understood that the above is only the optimal embodiment of the present disclosure and is not intended to limit the present disclosure. Any modification, supplement, and equivalent replacement made within the scope of the principles of the present disclosure should be included in the protection scope of the present disclosure.

What is claimed is:

1. A fluid-induced vibration energy harvesting apparatus with a non-rotating bluff body, comprising a bluff body, two rotating shafts, two connecting shafts, two elastic beams, a piezoelectric film, mounting blocks, fixing frames, a sliding rail, sliding blocks, and a fastening device;

the bluff body as a whole is in a shape of a thin-walled cuboid with non-closed ends, two rectangular grooves each is reserved on an edge of the bluff body for connecting to each of the two elastic beams respectively; a first end face of each of the rectangular grooves is provided with a first square entity, and a second end face of each of the rectangular grooves is provided with a second square entity; the first square entity and the second square entity are provided with a through hole and a blind hole respectively, for placing one of the rotating shafts;

the two connecting shafts each has one side provided with a central hole protruded for connecting to one of the rotating shafts and another side being a rectangular sheet connected to one of the elastic beams through an adhesive, wherein the connections of the two connecting shafts and the two rotating shafts limit rotational movements of the bluff body;

each of the elastic beams is placed between two mounting holes of each of the mounting blocks and between the fixing frames and the mounting blocks and is fastened by bolts;

the piezoelectric film is attached to a root of each of the elastic beams to achieve high efficiency of energy conversion;

the mounting blocks are generally rectangular, there are two mounting blocks, each of the mounting blocks comprises the two mounting holes, and the two mounting holes are consistent with two mounting holes on a first end of each of the fixing frames in shape and size;

the fixing frames are L-shaped as a whole, there are two fixing frames, a second end of each of the fixing frames has four positioning holes, the positioning holes are consistent with positioning holes on surfaces of the sliding blocks in shape and size, and are configured for connecting to the sliding blocks, and the first end of each of the fixing frames is provided with the two mounting holes configured for connecting to the mounting blocks;

the sliding rail is in a shape of a cuboid block as a whole;

the sliding blocks are T-shaped as a whole, there are two sliding blocks, a surface of each of the sliding blocks is provided with four positioning holes for connecting to each of the L-shaped fixing frames; and the fastening device is configured for fixing positions of the sliding blocks.

2. The fluid-induced vibration energy harvesting apparatus with the non-rotating bluff body according to claim 1, wherein the through hole and the blind hole are in a clearance fit with the rotating shaft to avoid a shaking phenomenon.

3. The fluid-induced vibration energy harvesting apparatus with the non-rotating bluff body according to claim 1, wherein the rotating shaft is slender cylinder shaped, and the rotating shaft is also in a clearance fit with the central hole of the connecting shaft.

4. The fluid-induced vibration energy harvesting apparatus with the non-rotating bluff body according to claim 1, wherein the elastic beams are made of a titanium alloy material.

5. The fluid-induced vibration energy harvesting apparatus with the non-rotating bluff body according to claim 1, wherein the piezoelectric film is made of epoxy resin.

6. The fluid-induced vibration energy harvesting apparatus with the non-rotating bluff body according to claim 1, wherein the fastening device comprises an external handle, a spring, and a stopper, one end of the external handle is connected to the spring, one end of the spring is connected to the stopper, the spring and the stopper of the fastening device are placed as a whole in a groove of each of the sliding blocks, and when a distance between the two sliding blocks is adjusted to be appropriate, the external handle is rotated clockwise to squeeze the spring to drive the stopper to move axially towards an inner sidewall of the sliding rail, until the inner sidewall is touched indicating that tightening is complete and positions of the sliding blocks are fixed.

\* \* \* \* \*